US006514095B1

(12) United States Patent
Smith et al.

(10) Patent No.: US 6,514,095 B1
(45) Date of Patent: Feb. 4, 2003

(54) CABLE INTERFACE FOR ELECTRONIC EQUIPMENT ENCLOSURE

(75) Inventors: Kevan Smith, Overland Park, KS (US); Hans Marosfalvy, Lenexa, KS (US); Randall D. Hutchison, Shawnee, KS (US); Robert Schiffbauer, Olathe, KS (US); Tomasz Taubert, Overland Park, KS (US)

(73) Assignee: Special Product Company, Overland Park, KS (US)

( * ) Notice: Subject to any disclaimer, the term of this patent is extended or adjusted under 35 U.S.C. 154(b) by 0 days.

(21) Appl. No.: 09/916,523

(22) Filed: Jul. 27, 2001

Related U.S. Application Data
(60) Provisional application No. 60/221,234, filed on Jul. 27, 2000.

(51) Int. Cl.[7] ............................................. H01R 13/62
(52) U.S. Cl. ...................................... 439/306; 439/445
(58) Field of Search ................................ 439/306, 307, 439/308, 309, 564, 537, 445, 447, 448

(56) References Cited

U.S. PATENT DOCUMENTS

| | | | | |
|---|---|---|---|---|
| 4,060,299 A | * | 11/1977 | Williams | 439/289 |
| 4,070,083 A | * | 1/1978 | DiPalma | 439/445 |
| 4,449,576 A | | 5/1984 | Baum et al. | 165/104.33 |
| 4,465,899 A | | 8/1984 | Mauclere et al. | 174/52.1 |
| 4,528,615 A | | 7/1985 | Perry | 361/722 |
| 4,629,275 A | * | 12/1986 | Maul | 174/DIG. 8 |

(List continued on next page.)

FOREIGN PATENT DOCUMENTS

| | | | | |
|---|---|---|---|---|
| GB | 2193552 | 2/1988 | | H04B/9/00 |
| JP | 57102058 | 6/1982 | | H01L/23/34 |
| JP | 6079834 | 5/1985 | | H04B/3/02 |
| JP | 865868 | 3/1996 | | H02G/9/02 |

OTHER PUBLICATIONS

Thermacore Inc. sales brochure, "heat pipes for electronics cooling applications", 4 page.
Thermacore Inc. Product Data Guide, "Miniature Heat Pipes," Sep. 24, 1996, 1 page.
Thermacore Inc. brochure, "Common Questions About Health Pipes," Sep. 23, 1996, 2 pages.
Thermacore Inc. sales brochure, "The Leader in Health Pipe Technology", 4 pages.

*Primary Examiner*—Tulsidas Patel
(74) *Attorney, Agent, or Firm*—Hovey Williams LLP (57) ABSTRACT

A cable interface (10) operable to interface a cable trunk line with an electronic equipment enclosure (12) via a pendant cable (14), thereby providing for quick and convenient connection and disconnection, when desired, of the equipment enclosure (12) from the pendant cable (14). The equipment enclosure (12) may house a variety of electronic equipment, such as, for example, telecommunications, signaling, and similar electronic equipment, including, for example, repeater and doubler cards. The preferred cable interface (10) broadly comprises a first connector half (16); a mounting plate (18); a second connector half (20); a free-spinning nut (22); a security cover (24); and a flexible cable extension (26). The security cover (24) cooperates with the second connector half (20) to restrict unauthorized access to the connection.

31 Claims, 8 Drawing Sheets

U.S. PATENT DOCUMENTS

| | | | |
|---|---|---|---|
| 4,679,250 A | 7/1987 | Davis et al. ................ 359/141 |
| 4,858,068 A | 8/1989 | Bitller et al. ................ 361/679 |
| 4,962,445 A | 10/1990 | Pelet et al. ................ 361/722 |
| 5,060,115 A | 10/1991 | Sewell ...................... 361/710 |
| 5,105,337 A | 4/1992 | Bitller et al. ................ 361/722 |
| 5,251,099 A | 10/1993 | Goss et al. ................ 361/721 |
| 5,329,425 A | 7/1994 | Leyssens et al. ........... 361/701 |
| 5,343,358 A | 8/1994 | Hilbrink .................... 361/700 |
| 5,380,224 A * | 1/1995 | DiCicco ..................... 439/447 |
| 5,777,846 A | 7/1998 | Hayes et al. ................ 361/690 |
| 5,842,514 A | 12/1998 | Zapach et al. ......... 165/104.33 |
| 5,844,777 A | 12/1998 | Gates ........................ 361/700 |
| 5,883,784 A | 3/1999 | Hughes et al. .............. 361/707 |
| 5,896,268 A | 4/1999 | Beavers .................... 361/690 |
| 5,930,113 A | 7/1999 | McCann .................... 361/704 |
| 5,943,219 A | 8/1999 | Bellino et al. .............. 361/816 |
| 5,949,650 A | 9/1999 | Bulante et al. ............. 361/704 |
| 6,025,991 A | 2/2000 | Saito ......................... 361/704 |
| 6,028,769 A | 2/2000 | Zurek ........................ 361/704 |
| 6,046,908 A | 4/2000 | Feng ......................... 361/707 |
| 6,055,157 A | 4/2000 | Bartilson ................... 361/699 |
| 6,104,611 A | 8/2000 | Glover et al. .............. 361/700 |
| 6,135,800 A * | 10/2000 | Majors ....................... 439/321 |
| 6,183,293 B1 * | 2/2001 | Kieninger .................. 439/551 |
| 6,220,888 B1 * | 4/2001 | Correa ....................... 439/445 |
| 6,244,332 B1 | 6/2001 | Gesklin et al. ............ 165/80.3 |
| 6,252,775 B1 | 6/2001 | Kuroda ...................... 361/707 |
| 6,292,556 B1 | 9/2001 | Laetsch ..................... 339/338 |

* cited by examiner

CABLE INTERFACE FOR ELECTRONIC EQUIPMENT ENCLOSURE

RELATED APPLICATIONS

This application claims priority benefit, with regard to all common subject matter, of a provisional application titled "Segmented Telecommunications Enclosure", Serial No. 60/221,234, filed Jul. 27, 2000, which is hereby incorporated into the present application by reference.

BACKGROUND OF THE INVENTION

1. Field of the Invention

The present invention relates to electronic equipment enclosures and cable interfaces for connecting the equipment enclosures with pendant cables and carrier trunk lines. More particularly, the present invention relates to a quick connect/disconnect pressure-sealed cable interface for connecting an electronic equipment enclosure to a signal-carrying trunk line via a pendant cable, wherein the equipment enclosure houses telecommunications, signaling, or other electronic equipment, including, for example, repeater and doubler cards.

2. Description of the Prior Art

It is often necessary to house telecommunications, signaling, and other electronic equipment in protective electronic equipment enclosures so that the equipment may be located where needed, often being mounted on telephone poles or within subterranean manholes. For example, ever-increasing use of wide area networks (WANs), particularly the Internet, and other telecommunication innovations has increased demand for high-speed, high-bandwidth digital telecommunications services, such as ISDN, (X)DSL, and T1, in homes and businesses. Due to signal propagation limitations, these digital services require special electronic equipment, including repeaters and doublers, to repeat signals when end users are too far from a provider's central office.

The equipment enclosures must be connected to a carrier trunk line via a pendant cable carrying signals and other services, such as pressurized air, to and from the equipment enclosure and the electronic equipment housed therein. Currently, the pendant cable is hardwired at one end to the electronic equipment, allowed to project from the equipment enclosure, and, once the equipment enclosure is mounted, cut into the carrier trunk line. Unfortunately, such hardwiring precludes quick and convenient connection and disconnection of the equipment enclosure for removal, maintenance, or replacement. Furthermore, because the pendant cable itself must pass directly into the equipment enclosure, leakages can develop, particularly if the cable or enclosure is roughly or improperly handled. For example, it is common practice to use the hardwired pendant cable to lower the heavy equipment enclosure into the manhole during installation. Such rough or improper handling can result in air escaping from the pressurized interior of the equipment enclosure, or can result in moisture or dust entering the equipment enclosure and damaging the electronic equipment.

Additionally, the pendant cable is typically jacketed in protective steel, making it substantially inflexible and requiring that the pendant cable connect to or exit the equipment enclosure at or near a proper angle for directly intersecting the carrier trunk line. This limitation can be difficult to accommodate in tight quarters, such as for example, subterranean manholes, where mounting locations may be dictated by size and space limitations that do not allow for the required mounting orientation.

Similar problems are encountered when installing and maintaining other electronic equipment enclosures, including signaling equipment enclosures, such as are used, for example, in controlling traffic signals.

Due to the above-identified and other limitations of the current art, a need exists for an improved mechanism for coupling a pendant cable with an electronic equipment enclosure.

SUMMARY OF THE INVENTION

The present invention solves the above-described and other problems and disadvantages to provide a distinct advance in the art of cable interfaces for electronic equipment enclosures. More particularly, the present invention provides a quick connect/disconnect pressure-sealed cable interface for connecting an electronic equipment enclosure to a signal-carrying trunk line via a pendant cable, wherein the equipment enclosure houses telecommunications, signaling, or other electronic equipment, including, for example, repeater and doubler cards.

The preferred cable interface broadly comprises a first connector half; a mounting plate; a second connector half; a free-spinning nut; a security cover; and a flexible cable extension. The first and second cable connector halves are male and female portions of a complete cable connector, and an alignment guide facilitates proper alignment of and prevents damage to the male and female connector components. A wire bundle connects at one end to the electronic equipment within the equipment enclosure, and at another end to the first cable connector half. A bottom portion of the first cable connector half is externally threaded. The mounting plate removably couples the first cable connector half to an interior or exterior surface of the equipment enclosure, preferably using threaded studs, such that the first connector half projects through the surface of the equipment enclosure. The second cable connector half provides one or more projecting tabs, each presenting a hole operable to receive a conventional padlock or combination lock. The free-spinning nut is spinably coupled with the second connector half and internally threaded in correspondence with the threaded exterior bottom portion of the first connector half, and operable when tightened thereon to secure the connector halves together.

The security cover is operable to prevent unauthorized disconnection by substantially covering the connected first and second connector halves and the free-spinning nut. The security cover provides cutouts corresponding to the projecting tabs of the bottom portion of the second connector half and through which the projecting tabs may project such that the holes therein are exposed. Thus, when the first and second connector halves are connected, and the free-spinning nut tightened, the security cover may be placed thereover and a lock placed on the projecting tab so that the security cover cannot be lowered to expose the connection without removing the lock.

The cable extension is a flexible portion of the otherwise steel-sheathed inflexible pendant cable, thereby accommodating tight radius turns up to 90° relative to the equipment enclosure. The standard solid steel sheathing found in prior art cables is replaced in the present invention with a mesh steel sheathing over the flexible cable extension portion of the pendant cable, thereby advantageously retaining the protective qualities of steel sheathing while introducing the desired flexibility.

Thus, the cable interface of the present invention advantageously allows for quick and convenient connection and disconnection of the pendant cable from the equipment enclosure, thereby facilitating efficient removal and replacement of the equipment enclosure during, for example, maintenance or upgrade. Furthermore, the pressure-sealed interface is substantially less prone to leakage than the prior art, and can be further improved by coating or covering leak-prone areas with a sealing or potting material. Additionally, the lockable security cover advantageously provides a mechanism for preventing unauthorized disconnection. Additionally, the flexible cable extension, which uses steel mesh rather than solid steel jacketing, allows the pendant cable to affect curves up to 90°, thereby accommodating a greater variety of equipment enclosure mounting orientations relative to the carrier trunk line.

The cable interface of the present invention allows one or more pendant cables to be cut-into the trunk line substantially before or after the equipment enclosures and electronic equipment are installed This feature is particularly advantageous where cable splicing and enclosure or equipment installation is performed in phases by different technicians or crews. In order to prevent contaminants, such as moisture, debris, and dust, from entering either the cut-in pendant cable or mounted equipment enclosure, or to prevent pressurized air escaping therefrom, a two-way cap is provided operable to cap either the first or second connector half, as desired.

These and other features of the present invention are more fully described below in the section entitled DETAILED DESCRIPTION OF A PREFERRED EMBODIMENT.

BRIEF DESCRIPTION OF THE DRAWING FIGURES

A preferred embodiment of the present invention is described in detail below with reference to the attached drawing figures, wherein.

DETAILED DESCRIPTION OF A PREFERRED EMBODIMENT

Figure 1:
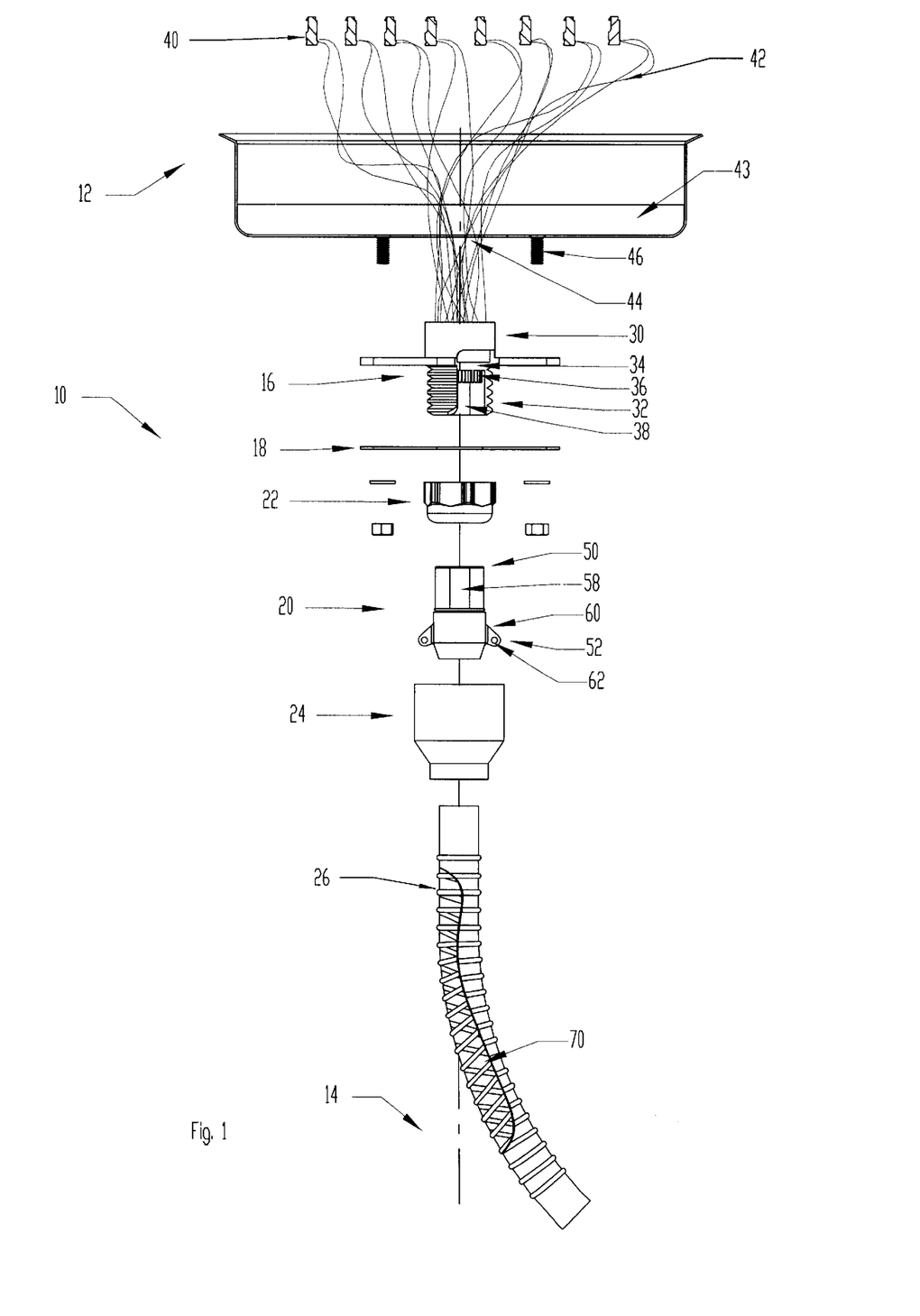
FIG. 1 is an exploded elevation view of a preferred embodiment of the present invention with portions broken away to show interior detail.
Figure 2:
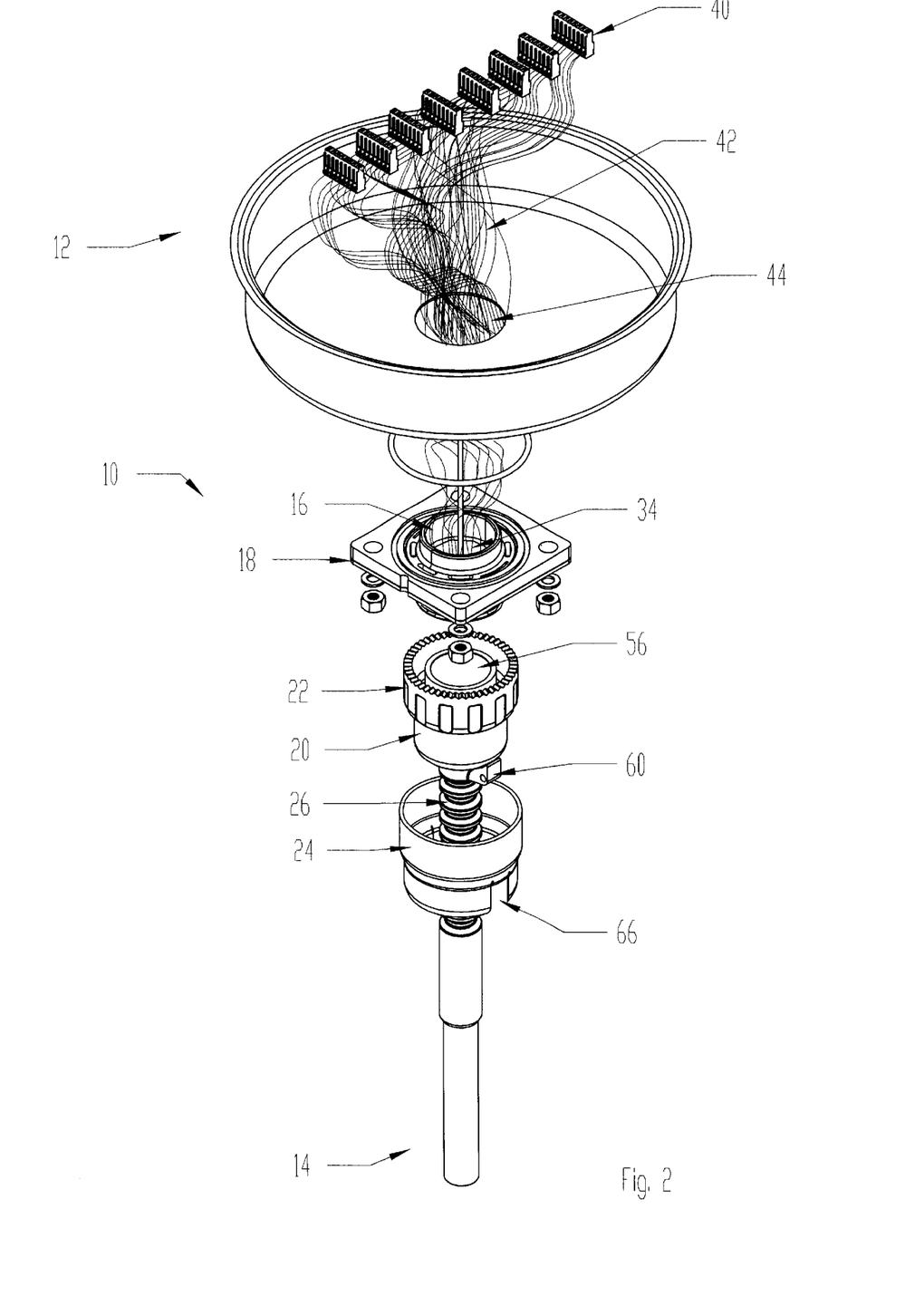
FIG. 2 is an exploded isometric view of the embodiment shown in FIG. 1, wherein portions of the present invention are shown in a preferred first configuration.
Figure 4:
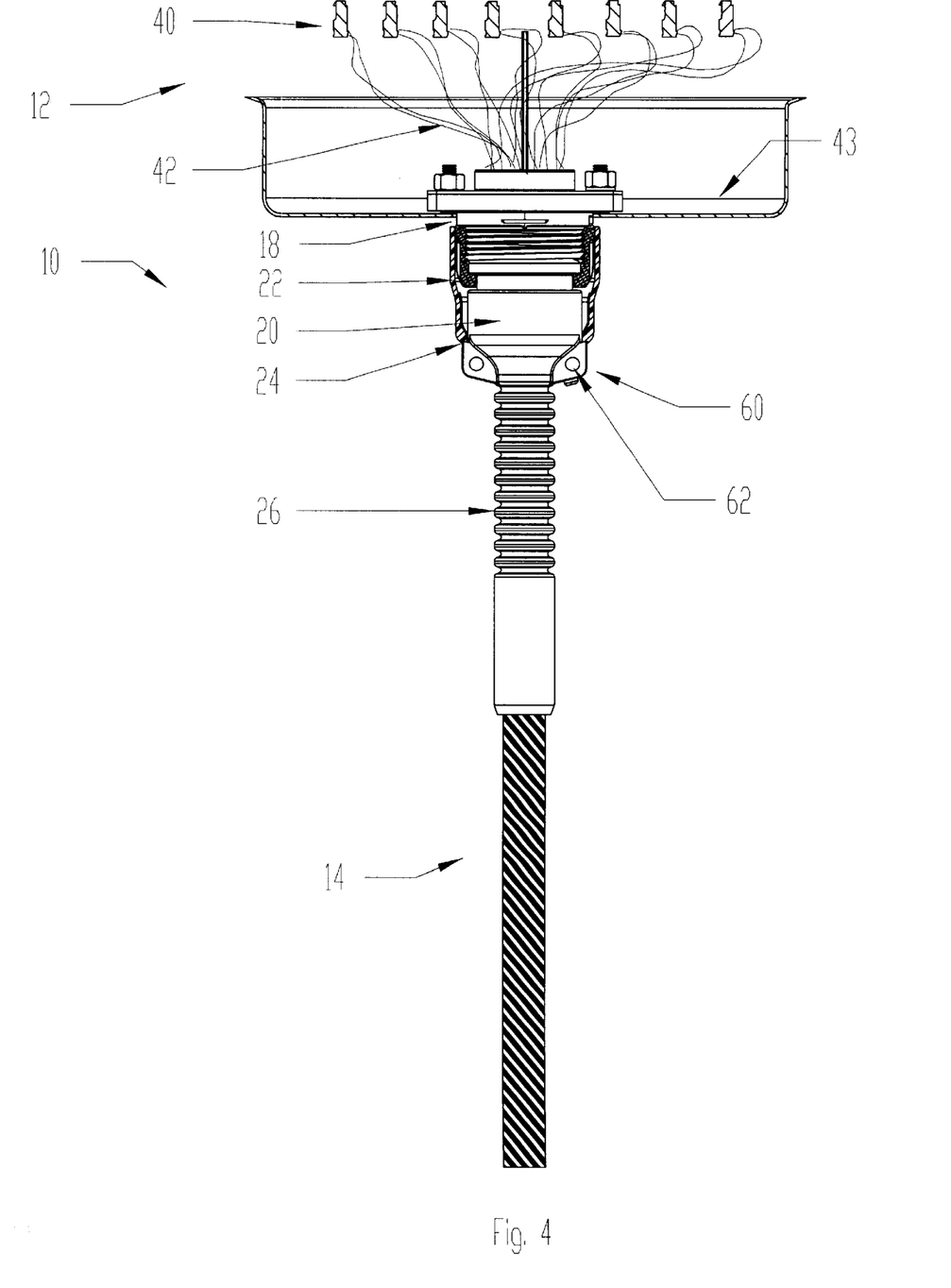
FIG. 4 is a sectional elevation view of the assembled embodiment shown in FIG. 2.

Referring to FIGS. 1, 2, and 4, a cable interface 10 is shown constructed in accordance with a preferred embodiment of the present invention, and operable to interface a carrier trunk line (not shown) with an electronic equipment enclosure 12 via a pendant cable 14, thereby advantageously providing for quick and convenient connection and disconnection, when desired, of the equipment enclosure 12 from the pendant cable 14. The equipment enclosure 12 may house a variety of electronic equipment, such as, for example, telecommunications, signaling, and similar electronic equipment, including, for example, repeater and doubler cards. Thus, the present invention is independent of any particular equipment enclosure or electronic equipment housed therewithin. The preferred cable interface 10 broadly comprises a first connector half 16; a mounting plate 18; a second connector half 20; a free-spinning nut 22; a security cover 24; and a flexible cable extension 26.

Figure 5:
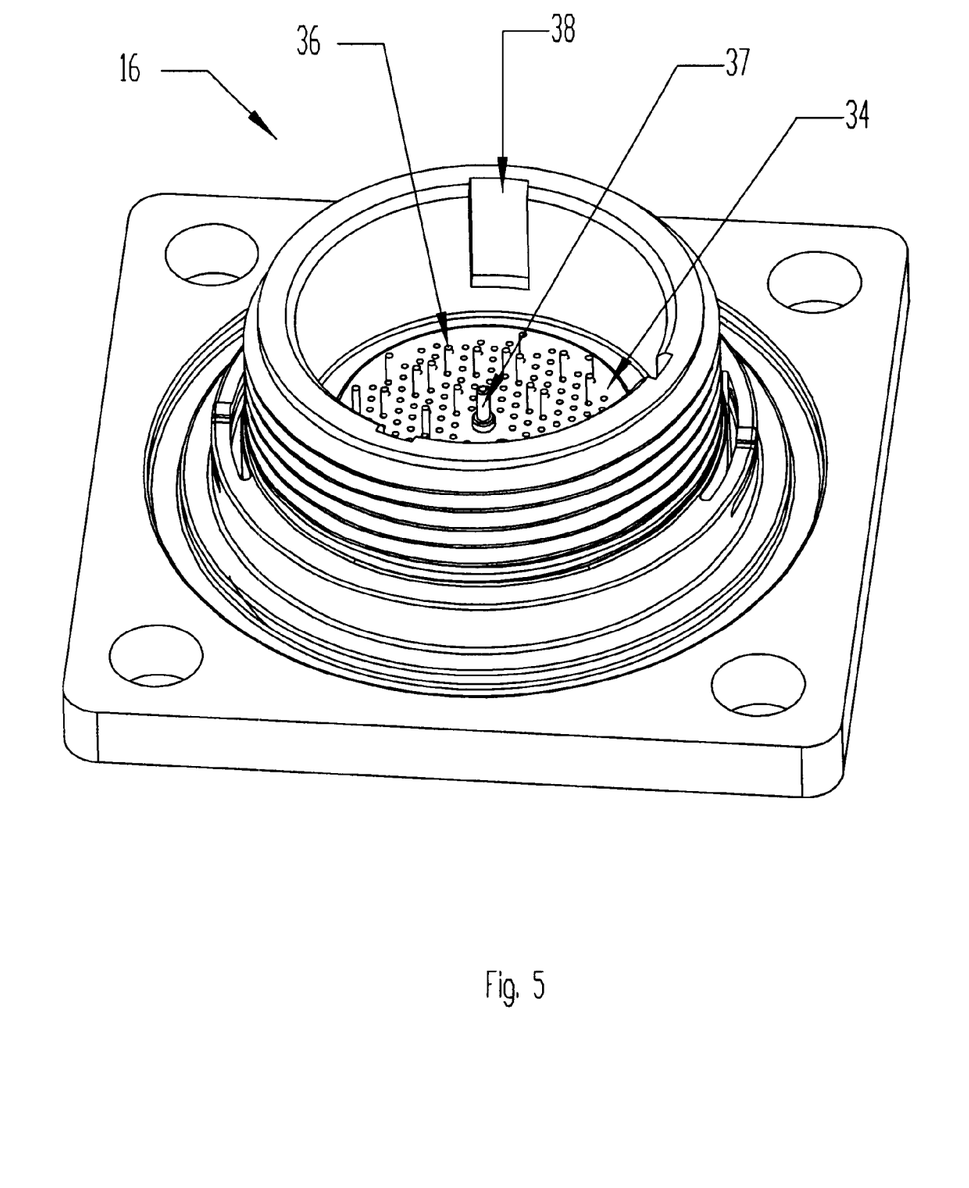
FIG. 5 is an isometric view of a first connector half portion of the embodiment shown in FIG. 1.

Referring also to FIG. 5, the first connector half 12 provides a substantially cylindrical male connector half having a top portion 30, including a top opening; a bottom portion 32, including a bottom opening; an interior; and an exterior. An interior bulkhead 34 sealedly separates the top portion 30 from the bottom portion 32. A plurality of electrical pins 36 and an air tube 37 project from the bulkhead 34 toward the bottom opening. The air tube 37 is operable to supply pressurized air to the equipment enclosure 12 in order to maintain a positive pressure therewithin and prevent entry of potentially damaging moisture or dust. The exterior of the bottom portion 32 of the first connector half 16 is threaded. The interior of the bottom portion 32 presents one half of an alignment guide, in this case a groove 38 or other depression or recess, for ensuring proper alignment of the first and second connector halves 16,20, as described below.

The equipment enclosure 12 provides a plurality of electrical connectors 40 for electrically coupling the electronic equipment therewithin with a wire bundle 42. An exit hole 44 is provided in the equipment enclosure 12 corresponding to the top opening of the first connector half 16 such that the wire bundle 42 may pass through the top opening thereof to be operatively coupled with the electrical pins 36. The top portion 30 of the first connector half 16 may be covered or filled with a sealing or potting material, such as, for example, a rubber compound, to protect the electrical connections and prevent leakage thereabout. An interior portion of the equipment enclosure 12 surrounding the exit hole 44 may be similarly filled with a potting compound 43.

The mounting plate 18 is operable to removably couple the first connector half 16 with the equipment enclosure 12, preferably using a plurality of threaded studs 46. A gasket 48 or O-ring may be used to substantially seal the mounting plate 18 to the equipment enclosure 12, thereby preventing pressurized air from escaping and moisture and dust from entering.

Figure 3:
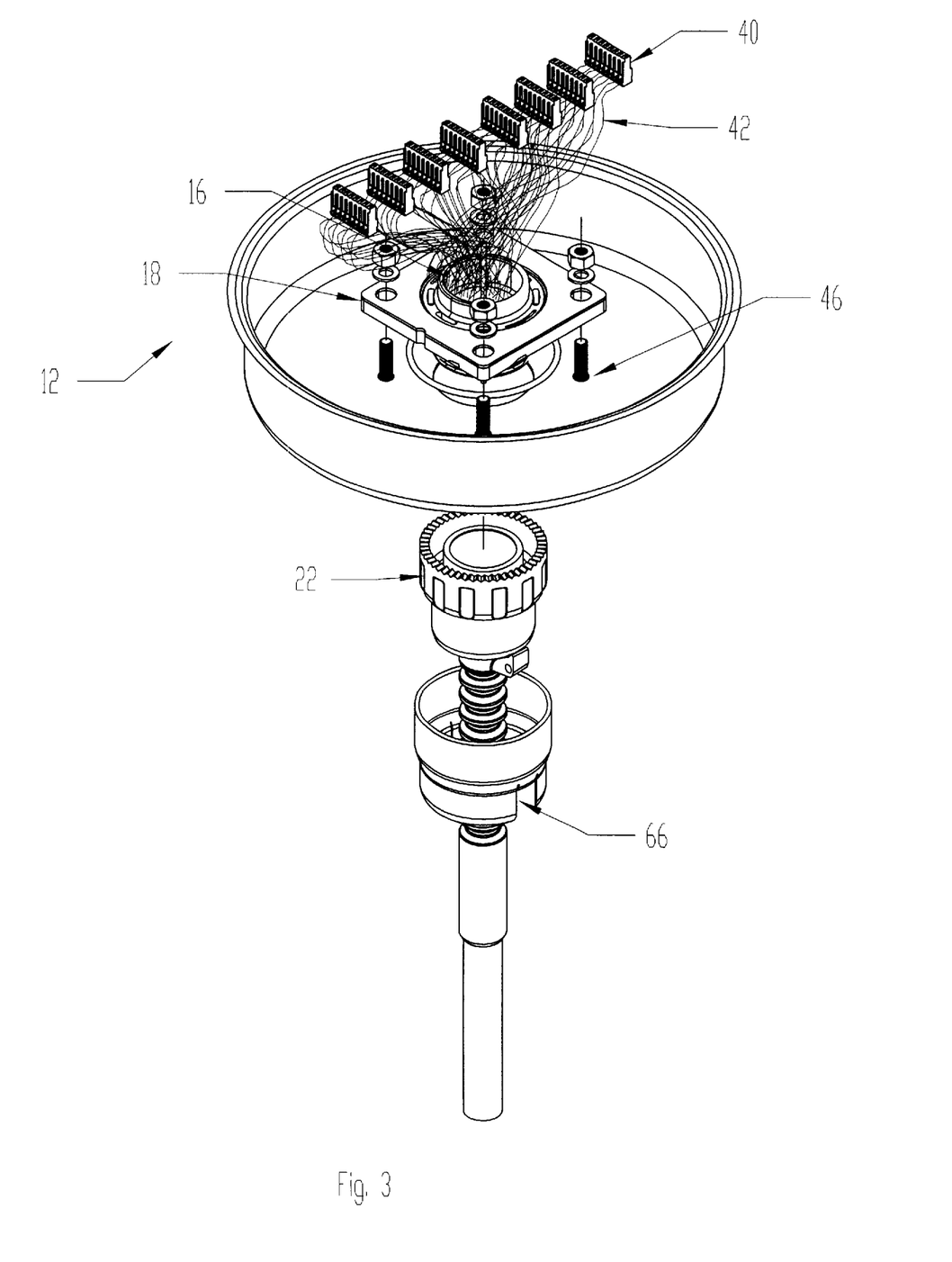
FIG. 3 is an exploded isometric view of an embodiment substantially similar to the embodiment shown in FIG. 1, wherein portions of the present invention are shown in a preferred second configuration.

Referring also to FIG. 3, the first connector half 16 and mounting plate 18 are alternatively mounted to an exterior or interior surface of the bottom of the equipment enclosure 12. In the former case, the top portion 30 of the first connector half 16 projects through the exit hole 44 in the bottom of the equipment enclosure; in the latter case, the bottom portion 32 projects through the exit hole 44.

Figure 6:
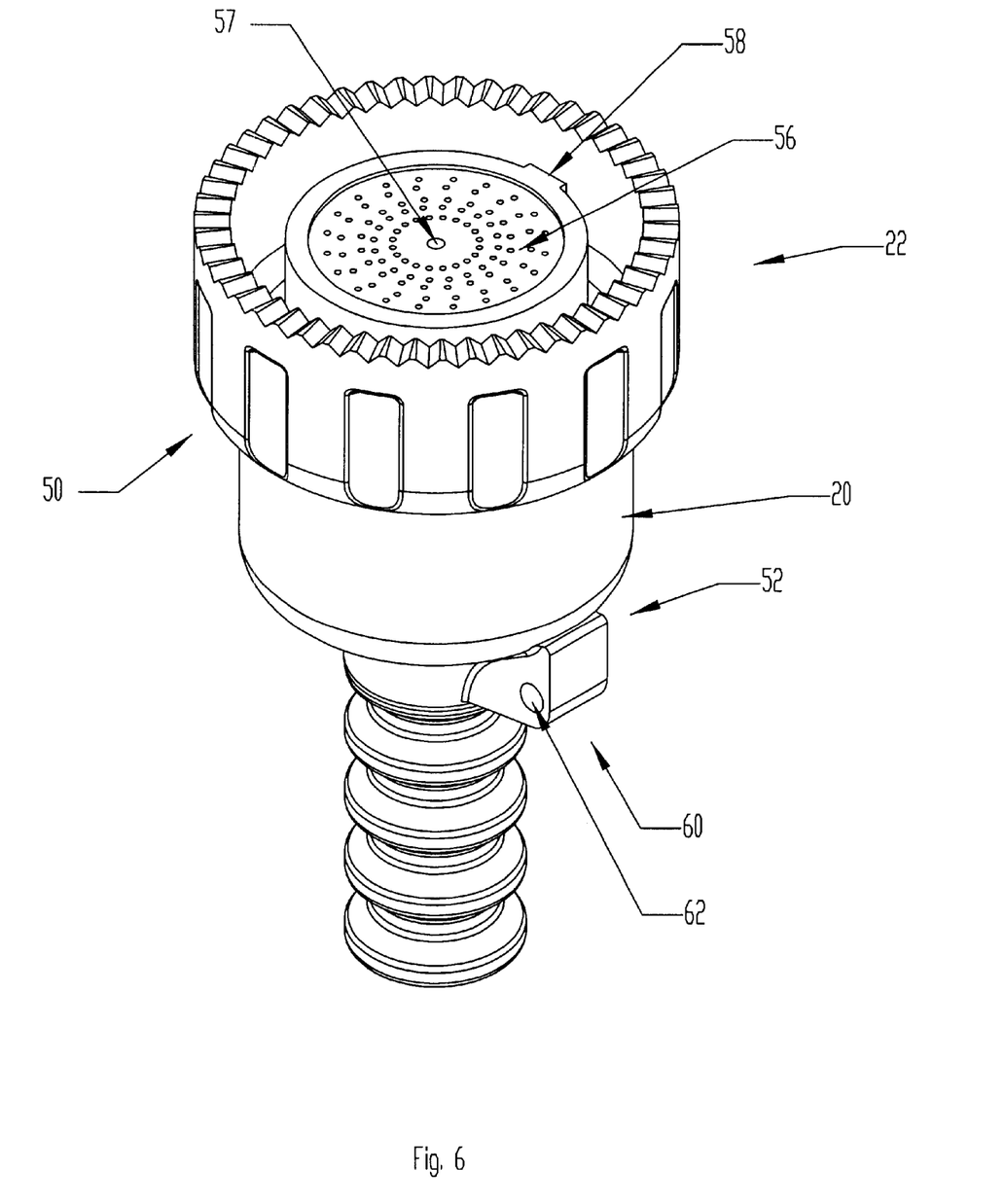
FIG. 6 is an isometric view of a second connector half portion of the embodiment shown in FIG. 1.

Referring also to FIG. 6, the second connector half 20 provides a substantially cylindrical female connector half having a top portion 50, including a top opening; a bottom portion 52, including a bottom opening; an interior; and an exterior. The top portion 50 of the second connector half 20 corresponds to and is receivable within the bottom portion 32 of the first connector half 16. The top portion 50 presents a plurality of pin slots 56 and an air tube 57 corresponding to and operable to receive the electrical pins 36 and air tube 37 of the first connector half 16. The exterior surface presents a second half of the alignment guide, in this case a projecting key 58 corresponding to and alignable with the groove 38 or depression or other recess provided in the first connector 16. The bottom portion 52 includes one or more projecting tabs 60, each presenting a hole 62 operable to receive a padlock or combination lock.

The free-spinning nut 22 is operable to threadedly secure together the first and second connector halves 16,20, with the free-spinning nut 22 being spinably coupled with the second connector half 20, and internally threaded in correspondence with the threaded exterior bottom portion 32 of the first connector half 16. Once the first and second connector halves 16,20 are properly aligned and connected, with the electrical pins 36 being received within the corresponding pin slots 56, the free-spinning nut 22 is used to more securely couple the secure connector halves 16,20 to one another. One or more O-rings or other similar internal sealing mechanisms may be used to substantially seal the connected first and second connector halves 16,20.

The security cover 24 is operable to substantially cover and secure the connected first and second connector halves 16,20 and the free-spinning nut 22, thereby preventing unauthorized disconnection. The security cover 24 provides cutouts 66 corresponding to the projecting tabs 60 of the bottom portion 52 of the second connector half 20 and through which the projecting tabs 60 may project such that the through holes are exposed 62.

The cable extension 26 is a flexible portion of the otherwise solid steel-sheathed inflexible pendant cable 14, thereby accommodating tight radius turns up to 90° relative to the equipment enclosure 12. The cable extension is electrically connected to the bottom portion 52 of the second connector half 20. The standard solid steel sheathing found in prior art cables is replaced in the present invention with a mesh steel sheathing over the flexible cable extension portion of the pendant cable, thereby advantageously retaining the protective qualities of steel sheathing while introducing the desirable flexibility.

Figure 7:
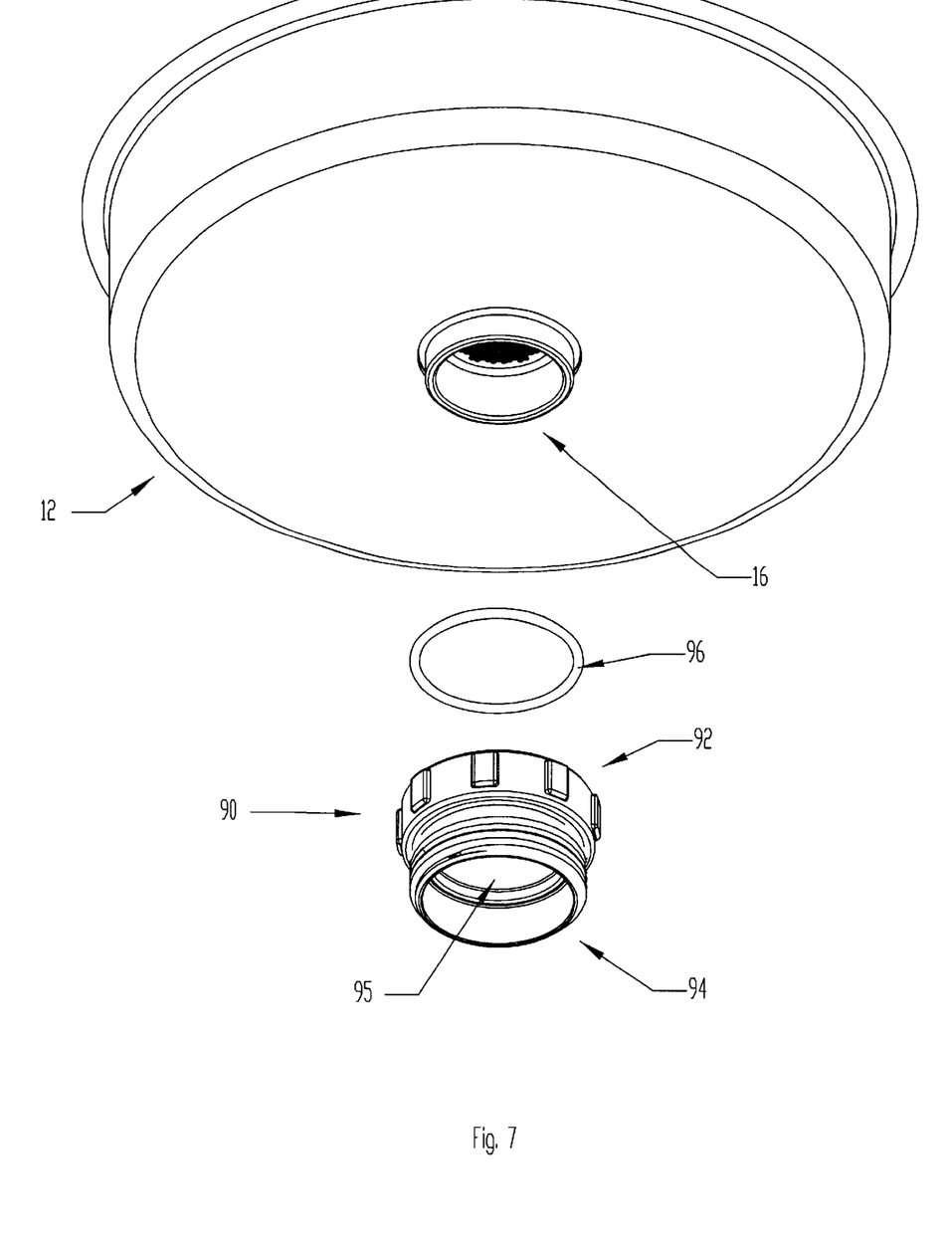
FIG. 7 is an exploded isometric view of a preferred embodiment of a two-way cap portion of the present invention, wherein the two-way cap is shown in conjunction with the first connector half.
Figure 8:
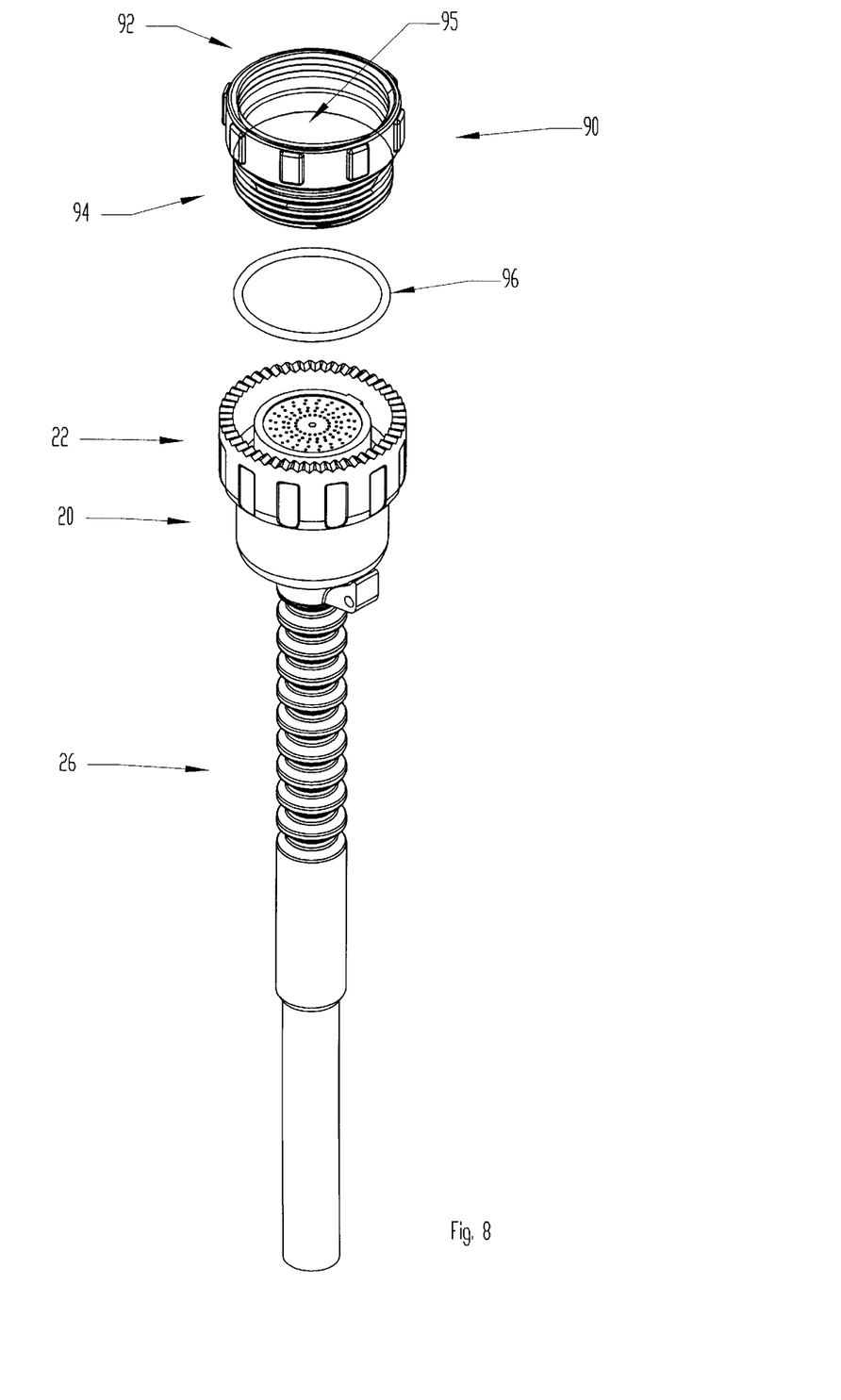
FIG. 8 is an exploded isometric view of a preferred embodiment of a two-way cap portion of the present invention, wherein the two-way cap is shown in conjunction with the second connector half.

As mentioned, the cable interface 10 of the present invention allows one or more pendant cables 14 to be cut-into the trunk line substantially before or after the equipment enclosures 12 and electronic equipment are installed. This feature is particularly advantageous for partial phased installations where cable splicing and enclosure or equipment installation is performed in phases by different technicians or crews. Referring to FIGS. 7 and 8, in order to prevent contaminants, such as moisture, debris, and dust, from entering either the cut-in pendant cable 14 or mounted equipment enclosure 12, or to prevent pressurized air escaping therefrom, an environmental seal or two-way cap 90 is provided operable to cap either the first or second connector half 16,20, as desired. The cap 90 is substantially cylindrical, having a first internally-threaded end 92 and a second externally threaded end 94 corresponding, respectively, to the first and second connector halves 16,20. A substantially sealed barrier 95 is provided between the first and second ends 92,94 such that, when the cap 90 is installed on either the first or second connector half 16,20, the passage of potentially damaging fluids or particulates is prevented. One or more O-rings 96 may be used to further seal the cap 90 to the first or second connector half 16,20.

In operation, the pendant cable 14 is cut-into the cable trunk, and the equipment enclosure 12 is mounted. Where either cut-in or mounting substantially precedes the other, the cap 90 may be used to substantially seal, as appropriate, the cut-in pendant cable 14 or mounted equipment enclosure 12. The cap 90 is easily removed when connection of the first and second connector halves 16,20 is possible and desired.

The wire bundle 42 will already have been connected to the electrical pins 36 within the first connector half 16, and said connections will already have been sealed with potting material. The wire connectors 40 are passed through the exit hole 44 to enter the equipment enclosure 12 where they will eventually be electrically coupled with the electrical equipment therewithin.

The mounting plate 18 is set over the first connector half 16 and secured to the equipment enclosure 12 using the threaded studs 46. As mentioned, the gasket 48 or O-ring may be used to substantially seal the mounting plate 18 to the equipment enclosure 12, thereby preventing pressurized air from escaping and moisture and dust from entering.

The second connector half 20 is then positioned for connection with the first connector half 16. As mentioned, the flexible cable extension allows the pendant cable 14, to which the second connector is attached, to bend in order to accommodate various mounting locations.

The key 58 of the exterior surface of the top portion 50 of the second connector half 20 is aligned with the corresponding groove 38 of the interior surface of the bottom portion 32 of the first connector half 16, and the second connector half 20 is pushed or plugged into the first connector half 16 such that the electrical pins 36 are properly received within the corresponding pins slots 56.

The free-spinning nut 22 is then threaded and tightened onto the threaded exterior of the bottom portion 32 of the first connector half 16. Because the free-spinning nut 22 spins freely on the second connector half 20, said second connector half 20 does not turn or bind as the free-spinning nut 22 is tightened.

The security cover 24 is then slipped over the connected first and second connector halves 16,20 and the free-spinning nut 22 such that the projecting tabs 60 of the bottom portion 52 of the second connector half 20 protrude from the cutouts of the security cover 24. A conventional padlock or combination lock is then passed through the holes of the projecting tabs 60 and secured, locking the security cover 24 in position and restricting unauthorized access to the free-spinning nut 22 and the connection generally, thereby preventing unauthorized disconnection.

As desired, such as when replacing or performing maintenance on the connected equipment enclosure 12, the lock may be removed, the security cover 24 lowered, the free-spinning nut 22 unthreaded from the first connector half 16, the first and second connector halves 16,20 separated, and the equipment enclosure 12 moved.

It will be appreciated by those with skill in the art that the order of connecting or disconnecting the equipment enclosure 10 may be varied as desired. For example, it may be deemed desirable to attach the mounting plate 18 and first connector half 16 to the equipment enclosure 12 prior to mounting the equipment enclosure 12. The present invention is not concerned with the order of assembly or connection or disconnection.

From the preceding description, it will be appreciated that the pressure-sealed cable interface 10 of the present invention advantageously allows for quick and convenient connection and disconnection of the pendant cable 14 from the equipment enclosure 12, thereby facilitating efficient removal and replacement of the equipment enclosure 12 during, for example, maintenance or upgrade. Furthermore, the cable interface 10 is substantially less prone to leakage than the prior art, and can be further improved by coating or covering leak-prone areas with a sealing or potting material 43. Additionally, the lockable security cover 24 advantageously provides a mechanism for preventing unauthorized disconnection. Additionally, the flexible cable extension 26, which uses steel mesh rather than solid steel jacketing, allows the pendant cable 14 to affect curves up to 90°, thereby accommodating a greater variety of equipment enclosure mounting orientations relative to the carrier trunk line.

Although the invention has been described with reference to the preferred embodiment illustrated in the attached drawing figures, it is noted that equivalents may be employed and substitutions made herein without departing from the scope of the invention as recited in the claims. For example, as noted above, the present invention is independent of the shape or construction of the equipment enclosure 12, and the nature of the electronic equipment housed therewithin. Thus, the equipment enclosure 12 may be used to house a variety of electronic equipment, including, for example, telecommunications equipment, such as repeater or doubler cards, or signaling equipment, such as might be used for controlling traffic signals.

Having thus described the preferred embodiment of the invention, what is claimed as new and desired to be protected by letters patent includes the following:

1. A cable interface for interfacing an electronic equipment enclosure with a cable, wherein the electronic equipment enclosure houses electronic equipment, the cable interface comprising:
   a first connector half coupled with a portion of the electronic equipment enclosure and operable to electrically interface with the electronic equipment housed therein, and presenting a first half of an alignment guide;
   a second connector half operable to electrically connect with the first connector half, and presenting a second half of the alignment guide corresponding to the first half such that the first and second halves of the alignment guide ensure proper alignment when connecting the first and second connector halves;
   a free-spinning nut operable to threadedly secure together the electrically connected first and second connector halves; and
   a security cover operable to substantially cover and secure the connected first and second connector halves and the free-spinning nut, thereby preventing unauthorized access thereto.

2. The cable interface as set forth in claim 1, wherein the cable interface is operable to allow pressurized gas to flow from the cable to the electronic equipment enclosure.

3. The cable interface as set forth in claim 1, wherein the electronic equipment is telecommunications equipment.

4. The cable interface as set forth in claim 1, wherein the electronic equipment is signaling equipment.

5. The cable interface as set forth in claim 1, wherein the portion of the electronic equipment housing coupled with the first connector half is potted with a sealing material.

6. The cable interface as set forth in claim 1, wherein the electronic equipment is electrically interfaced to the first connector half via a plurality of wire connectors and a wire bundle.

7. The cable interface as set forth in claim 1, wherein the electrical interface between the electronic equipment and the first connector half is potted with a sealing material.

8. The cable interface as set forth in claim 1, wherein the free-spinning nut is spinably coupled with one of the first and second connector halves and internally threaded in correspondence with an externally threaded portion of the other connector half.

9. The cable interface as set forth in claim 1, further comprising a mounting plate operable to secure the first connection half to the electronic equipment enclosure.

10. The cable interface as set forth in claim 1, further comprising a flexible cable extension substantially sheathed in a metal mesh and operable to curve up to approximately 90° to accommodate the cable, wherein the flexible cable extension is electrically connected to the second connector half.

11. A cable interface for interfacing an electronic equipment enclosure with a cable, wherein the electronic equipment enclosure houses electronic equipment, the cable interface comprising:
   a first connector half coupled with a portion of the electronic equipment enclosure and operable to electrically interface with the electronic equipment via a plurality of electrical connectors and a wire bundle;
   a second connector half operable to electrically connect with the first connector half, and further presenting a projecting tab having a hole operable to couple with a lock;
   a free-spinning nut spinably coupled with one of the first and second connector halves and internally threaded in correspondence with an externally threaded portion of the other one of the first and second connector halves, and operable to threadedly secure together the electrically connected first and second connector halves; and
   a security cover operable to substantially cover and secure the connected first and second connector halves and the free-spinning nut, and through which the projecting tab of the second connector half may project prior to coupling with the lock.

12. The cable interface as set forth in claim 11, wherein the cable interface is operable to allow pressurized gas to flow from the cable to the electronic equipment enclosure.

13. The cable interface as set forth in claim 11, wherein the electronic equipment is telecommunications equipment.

14. The cable interface as set forth in claim 11, wherein the electronic equipment is signaling equipment.

15. The cable interface as set forth in claim 11, wherein the electrical interface between the electronic equipment and the first connector half is potted with a sealing material.

16. The cable interface as set forth in claim 11, wherein the first and second connector halves each present a corresponding half of an alignment guide, including a projecting key and a corresponding groove, wherein the alignment guide is operable to ensure proper alignment when connecting the first and second connector halves.

17. The cable interface as set forth in claim 11, further comprising a mounting plate operable to secure the first connection half to the electronic equipment enclosure.

18. The cable interface as set forth in claim 11, further comprising a flexible cable extension substantially sheathed in a metal mesh and operable to curve up to approximately 90° to accommodate the cable, wherein the flexible cable extension is electrically connected to the second connector half.

19. A cable interface for interfacing an electronic equipment enclosure with a cable, wherein the electronic equipment enclosure houses electronic equipment and is pressurized with a gas, the cable interface comprising:
   a first connector half coupled with a portion of the electronic equipment enclosure, wherein the portion is potted with a sealing compound, and operable to electrically interface with the electronic equipment via a plurality of electrical connectors and a wire bundle, and presenting a first half of an alignment guide;

a second connector half operable to electrically connect with the first connector half and presenting a second half of the alignment guide corresponding to the first half such that the first and second halves of the alignment guide ensure proper alignment when connecting the first and second connector halves, the second connector half further presenting a projecting tab having a hole operable to couple with a lock; and a flexible cable extension substantially sheathed in a metal mesh and operable to curve up to approximately 90° to accommodate the cable, wherein the flexible cable extension is electrically connected to the second connector half.

20. The cable interface as set forth in claim 19, wherein the cable interface is operable to allow the pressurized gas to flow from the cable to the electronic equipment enclosure.

21. The cable interface as set forth in claim 19, wherein the electronic equipment is telecommunications equipment.

22. The cable interface as set forth in claim 19, wherein the electronic equipment is signaling equipment.

23. The cable interface as set forth in claim 19, wherein the electrical interface between the electronic equipment and the first connector half is potted with a sealing material.

24. The cable interface as set forth in claim 19, further comprising a mounting plate operable to secure the first connection half to the electronic equipment enclosure.

25. An electronic equipment enclosure for housing electronic equipment, wherein the electronic equipment enclosure is pressurized with a gas, the electronic equipment enclosure comprising:

a cable interface for interfacing the electronic equipment enclosure with a cable, wherein the cable is operable to provide electrical signal and the pressurized gas to the electronic equipment enclosure, the cable interface including first connector half coupled with a portion of the electronic equipment enclosure, wherein the portion is potted with a sealing compound, and operable to electrically interface with the electronic equipment via a plurality of electrical connectors and a wire bundle, and presenting a first half of an alignment guide, a second connector half operable to electrically connect with the first connector half, and presenting a second half of the alignment guide corresponding to the first half such that the first and second halves of the alignment guide ensure proper alignment when connecting the first and second connector halves, a free-spinning nut spinably coupled with one of the first and second connector halves and internally threaded in correspondence with an externally threaded portion of the other one of the first and second connector halves, and operable to threadedly secure together the electrically connected first and second connector halves, and a flexible cable extension substantially sheathed in a metal mesh and operable to curve up to approximately 90° to accommodate the cable, wherein the flexible cable extension is electrically connected to the second connector half.

26. The electronic equipment enclosure as set forth in claim 25, wherein the electronic equipment is telecommunications equipment.

27. The electronic equipment as set forth in claim 25, wherein the electronic equipment is signaling equipment.

28. A method of phasedly installing an electronic equipment enclosure, the method comprising the steps of:

(a) mounting the electronic equipment enclosure and sealing an exposed connector portion of the electronic equipment enclosure with an environmental seal; and (b) splicing a pendant cable into a signal-carrying trunk line, and then removing the environmental seal from the exposed connector portion, and, finally, connecting the pendant cable to the exposed connector portion.

29. The method as set forth in claim 28, wherein the environmental seal is a threaded cap such that the step of sealing the exposed connector portion involves screwing the threaded cap onto the exposed connector portion.

30. A method of phasedly installing an electronic equipment enclosure, the method comprising the steps of:

(a) splicing a pendant cable into a signal-carrying trunk line and sealing an exposed connector portion of the pendant cable with an environmental seal; and (b) mounting the electronic equipment enclosure, and then removing the environmental seal from the exposed connector portion, and, finally, connecting the exposed connector portion to the electronic equipment enclosure.

31. The method as set forth in claim 30, wherein the environmental seal is a threaded cap such that the step of sealing the exposed connector portion involves screwing the threaded cap onto the exposed connector portion.

* * * * *